(12) United States Patent
Wu

(10) Patent No.: US 6,278,116 B1
(45) Date of Patent: Aug. 21, 2001

(54) METHOD OF MONITORING DEEP ULTRAVIOLET EXPOSURE SYSTEM

(75) Inventor: Cheng-Kuan Wu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/370,773

(22) Filed: Aug. 9, 1999

(51) Int. Cl.⁷ ....................................................... B01T 1/20
(52) U.S. Cl. .......................... 250/365; 250/201; 250/548
(58) Field of Search .............................. 250/201, 201.2, 250/548, 200; 356/124; 355/53

(56) References Cited

U.S. PATENT DOCUMENTS

| | | | |
|---|---|---|---|
| 4,616,130 | * 10/1986 | Omata | 250/201 |
| 5,365,051 | * 11/1994 | Suzuki et al. | 250/201.2 |
| 5,615,006 | * 3/1997 | Hirukawa et al. | 356/124 |
| 5,793,471 | * 8/1998 | Kanda et al. | 355/53 |

* cited by examiner

Primary Examiner—Jack Berman
Assistant Examiner—Johnnie L Smith, II
(74) Attorney, Agent, or Firm—Thomas, Kayden, Horstemeyer & Risley, LLP

(57) ABSTRACT

A method of monitoring the conditions of a deep ultraviolet exposure station. In this invention, three usually separate conventional measurements including reticle blind accuracy, pre-alignment accuracy and overlay accuracy are integrated together. A patterned wafer having a photoresist layer thereon is provided. The photoresist layer on the wafer is exposed using a DUV exposure station. Relative positions of various markers are measured using an image-contrasting station. Hence, the reticle blind accuracy, the pre-alignment accuracy and the overlay accuracy are all determined in a single step.

4 Claims, 4 Drawing Sheets

METHOD OF MONITORING DEEP ULTRAVIOLET EXPOSURE SYSTEM

BACKGROUND OF THE INVENTION

1. Field of Invention

The present invention relates to a method of monitoring an exposure system. More particularly, the present invention relates to a method of monitoring the conditions of a deep ultraviolet exposure system to be used in the manufacturing of semiconductor products.

2. Description of Related Art

To increase the operating speed of electronic equipment, dimensions of semiconductor devices in an integrated circuit are gradually reduced. Recently, the production of devices having a feature size in the submicron range is possible. However, due to the reduction of some critical dimensions, alignment of various circuit layers becomes an important factor in obtaining high-quality semiconductor products. If there is any misalignment between one layer and the next, circuits are no longer properly connected and the entire wafer chip may have to be discarded.

At present, most wafer manufacturing facilities rely heavily on deep ultraviolet (DUV) exposure systems for multi-layer alignment. Since a deep ultraviolet ray has a short wavelength, very accurate alignment can be obtained.

Because a deep ultraviolet exposure station is a very expensive piece of equipment, too much time spent on unproductive testing operations is highly uneconomical. Hence, for a number of important baseline items, testing cannot be done on a daily basis.

In general, the three most common items a deep ultraviolet exposure station needs to be tested on include reticle blind accuracy, pre-alignment accuracy and overlay accuracy.

Using Nikon's deep ultraviolet exposure station as an example, a reticle blind accuracy check requires about half an hour. Hence, the reticle blind accuracy check is normally conducted once every three months. A pre-alignment accuracy check takes about twenty minutes while an overlay accuracy check takes about two hours. Hence, the pre-alignment and overlay accuracy checks are normally done once a month. However, such a low frequency of checking the DUV exposure station is likely to miss some errors that may affect the resulting quality of the products.

FIG. 1 shows a conventional method of checking the reticle blind accuracy. Reticle blind accuracy refers to the precision of horizontal distance between the reticle and the blind that surrounds the reticle. Adjustment of the reticle blind accuracy can be achieved by using a vernier at the center of an imaging screen. Size difference between a light-exposed region known as a shot 4 against the size of a dark image 6 produced by the projection of the DUV exposure station via the blind can be compared. Hence, the extent of too much or too little coverage of the blind when light exposure for shot 4 is made can be calculated. For a Nikon DUV exposure station, the acceptable range of error for over or under coverage falls between plus or minus two hundred micrometers.

If the blind opens too little, diffraction light will occur, leading to a colorful pattern on the scribe line of a wafer. This can lead to the formation of a particle source in the wafer.

On the other hand, if the blind opens too much, interference of the light pattern with a neighboring shot may happen, leading to incomplete pattern formation on the wafer. Furthermore, a model test key related to the manufacturing process is normally formed somewhere just outside an edge of the shot and hence may be over-exposed. Once the key is over-exposed, it no longer can function as a test mark in the manufacturing process.

Before the silicon wafer is exposed to light inside a DUV exposure station, the wafer must first move to a designated position so that the DUV exposure station can automatically look for an alignment mark. The designated position is located by a pre-alignment mark. This pre-alignment mark and the alignment mark for exposure are separated by a small distance. When the distance of separation is greater than a pre-assigned value, such as 25 micrometers, the DUV exposure station can no longer find the alignment mark for exposure. In other words, the alignment mark needs to be found by a manually controlled lever system.

Should anything abnormal occur to the pre-alignment mark during the earlier stages of circuit layer fabrication, the entire wafer has to be scrapped. Even when inaccuracy of the pre-alignment mark occurs much later, alignment of the DUV exposure station for forming the next layer is likely to be difficult. Sometimes, the station has to be shut down to fix such problems; hence, utility of the station is lowered.

Conventionally, accuracy of overlays can be achieved only by following sophisticated adjustment procedures. The procedures involve forming a first photoresist layer over the wafer, and transferring a mask pattern to the photoresist layer. A second photoresist layer is formed over the first photoresist layer, and a second mask is used to form another pattern on the second photoresist layer. Because both the first and the second photoresist layers have an alignment mark for exposure, a laser beam can be used for scanning the alignment marks. The results obtained from the laser scan can be used to adjust the overlay accuracy. The whole procedure is time consuming and its accuracy is rather low.

SUMMARY OF THE INVENTION

The present invention provides a simpler method of monitoring the running conditions of a deep ultraviolet (DUV) exposure system so that the system can be checked more frequently and faster.

To achieve these and other advantages and in accordance with the purpose of the invention, as embodied and broadly described herein, the invention provides a method of monitoring the operating conditions of a DUV exposure system. A silicon wafer is provided. Using a high-precision DUV exposure station and an etching station, photolithographic and etching processes are conducted to form a plurality of first shots on the wafer. Somewhere outside, along the edge of these first shots, are a first alignment mark for exposure and a first overlay mark. A photoresist layer is formed over the wafer. The wafer is placed inside a DUV exposure station that is under inspection. Amount of deviation between the position of the wafer inside the to-be inspected DUV station and the central point of the first alignment mark is recorded. The photoresist layer is exposed by the to-be-inspected DUV exposure station. The photoresist layer is developed to form a plurality of second shots, third shots and fourth shots. There are overlay markers around these second shots, third shots and fourth shots. Before exposure for the second shots is conducted, the blind in the DUV exposure station under inspection is positioned at a first uncovered distance permitting light from a light source to pass through. Before exposure for the third shots is conducted, the blind is positioned at a second uncovered distance. The second uncovered distance is smaller than the first uncovered distance by a specified first value. Similarly, before exposure for the fourth shots is conducted, the blind is positioned at a third uncovered distance. The third uncovered distance is greater than the first uncovered distance by a specified second value.

An image-contrasting machine is used to inspect the third shot and the fourth shot. If the third shot and the fourth shot can be found by the contrasting station, the blind has the required degree of accuracy. However, if the third shot and the fourth shot cannot be found by the contrasting station, the to-be-inspected DUV exposure station must be adjusted. The contrasting station next measures the relative positions of the first overlay marker and the second overlay marker. Value of the deviation between the first overlay marker and the second overlay marker due to separate exposures are computed and recorded. The recorded deviation between the two overlays is fed back to the DUV exposure station so that overlay accuracy can be increased.

In brief, this invention integrates tests of reticle blind accuracy, pre-alignment accuracy and overlay accuracy together so that inspection time is shortened and precision of the measurement is increased. In addition, the invention carries out most of the actual condition monitoring operations of the DUV exposure station using common and inexpensive equipment. Hence, more time can be spent by the station in actual production, or more inspections can be carried out to increase product quality.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
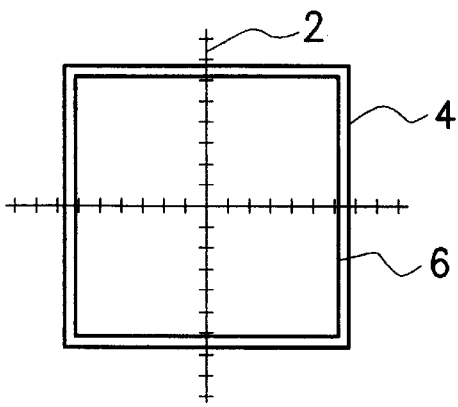
FIG. 1 shows a conventional method of checking the reticle blind accuracy.

Reference will now be made in detail to the present preferred embodiments of the invention, examples of which are illustrated in the accompanying drawings. Wherever possible, the same reference numbers are used in the drawings and the description to refer to the same or like parts.

Figure 2:
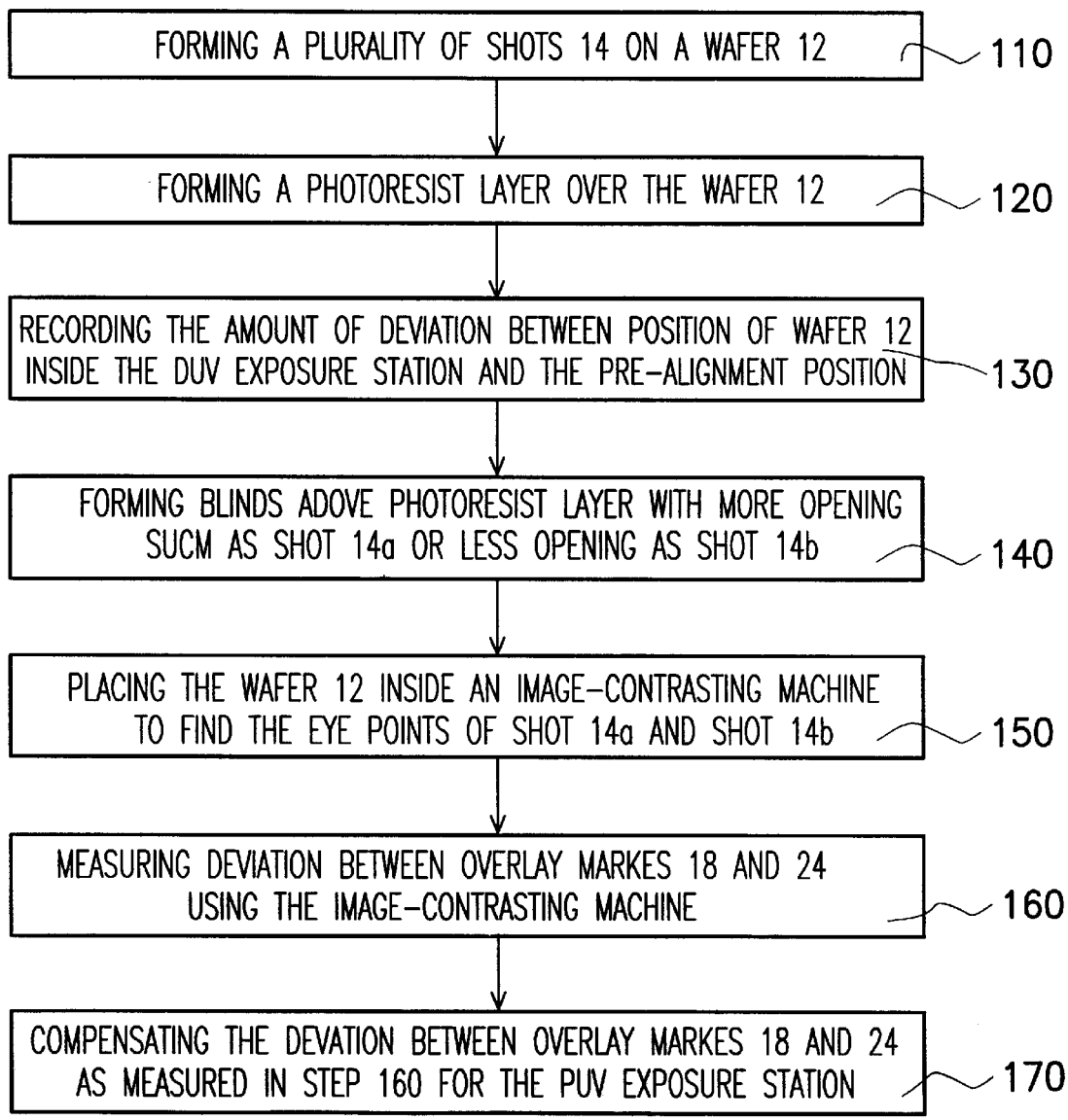
FIG. 2 is a flow chart showing the steps for monitoring the conditions of a deep ultraviolet exposure station according to this invention.
Figure 3A:
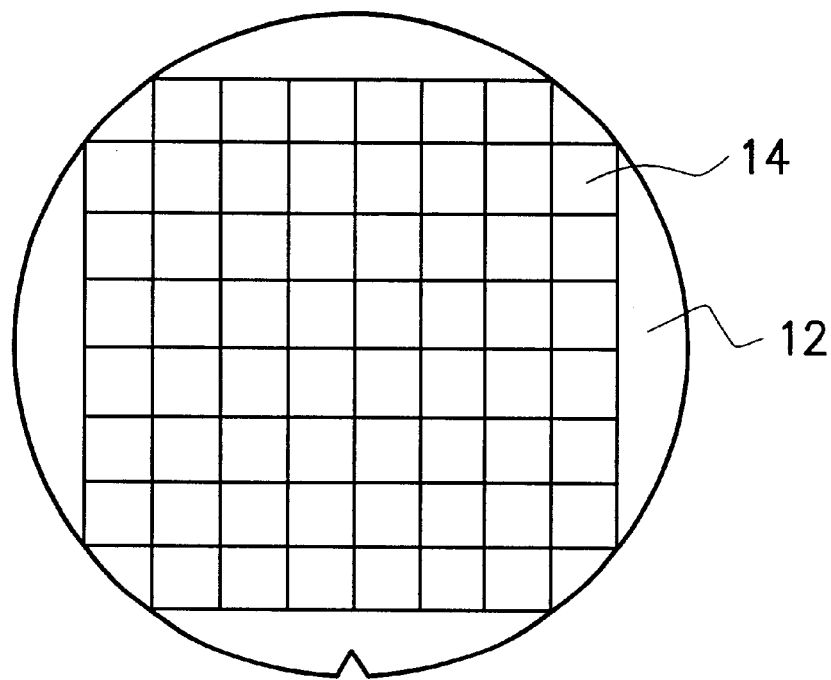
FIGS. 3A and 3B are diagrams showing alignment markers for exposure and overlay markers on a wafer.
Figure 3B:
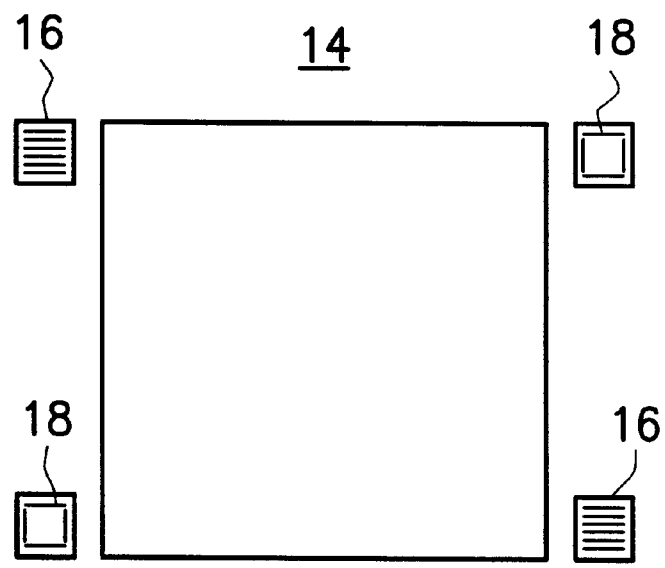

FIG. 2 is a flow chart showing the steps for monitoring the conditions of a deep ultraviolet exposure station according to this invention. FIGS. 3A and 3B are diagrams showing alignment markers for exposure and overlay markers on a wafer.

As shown in FIGS. 2, 3A and 3B, step 110 is carried out before proceeding on with the steps for monitoring the conditions of the deep ultraviolet exposure station. In step 110, a high-precision deep ultraviolet exposure station and an etching station are used to perform photolithographic and etching operations in sequence so that a number of shots 14 are formed on a wafer 12. Each shot 14 has alignment markers 16 for exposure and overlay markers 18 just outside their edge. The alignment markers 16 and the overlay markers 18 are used in subsequent exposure and overlay accuracy measurement, respectively. After step 110 is complete, step 120 in FIG. 2 is carried out to form a photoresist layer over the wafer 12.

Figure 4:
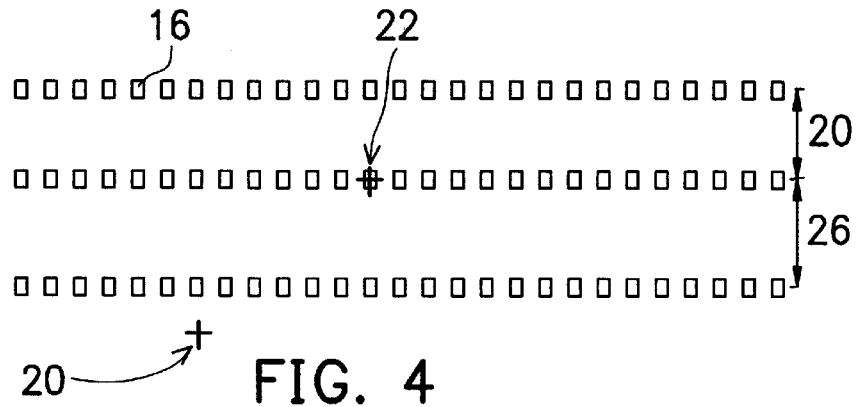
FIG. 4 illustrates the process of determining pre-alignment accuracy after a wafer is positioned inside a deep ultraviolet exposure station.

FIG. 4 illustrates the process of determining pre-alignment accuracy after a wafer is positioned inside a deep ultraviolet exposure station. As shown in FIG. 4, the wafer 12 is placed inside a to-be-inspected DUV exposure station. The amount of shift between the position 20 of the wafer 12 inside the station and the pre-alignment position 22 is recorded in step 130. The amount of shift between position 20 and position 22 of the wafer 12 must not exceed a pre-assigned value, for example, twenty-five micrometer. The pre-alignment position 22 is at the center point of the alignment marker 16. The amount of shift is recorded and is used as a reference parameter in a subsequent system check. The recording step can be finished in only about one minute, and hence can be conducted daily to monitor closely the conditions of the system.

Figure 5A:
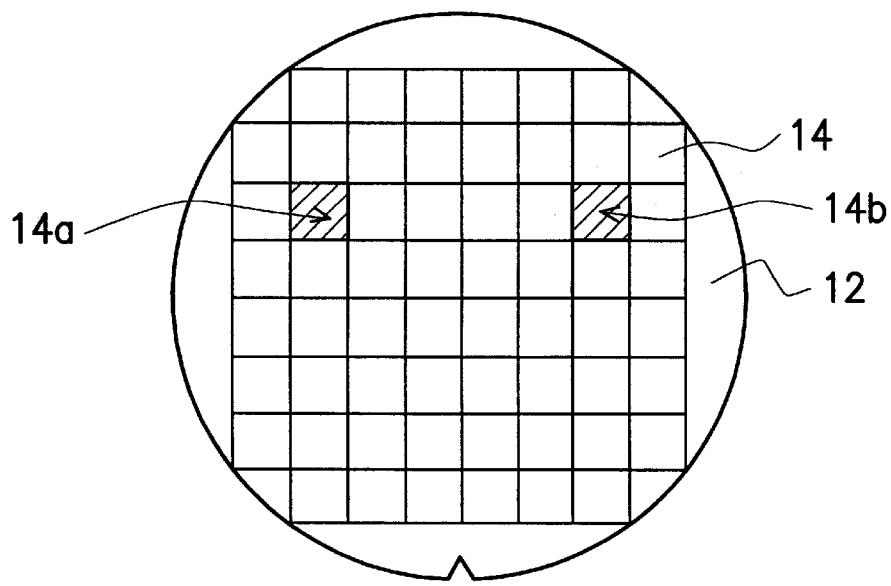
FIGS. 5A and 5B are diagrams showing alignment markers for exposure and overlay markers on a photoresist layer above a wafer.
Figure 5B:
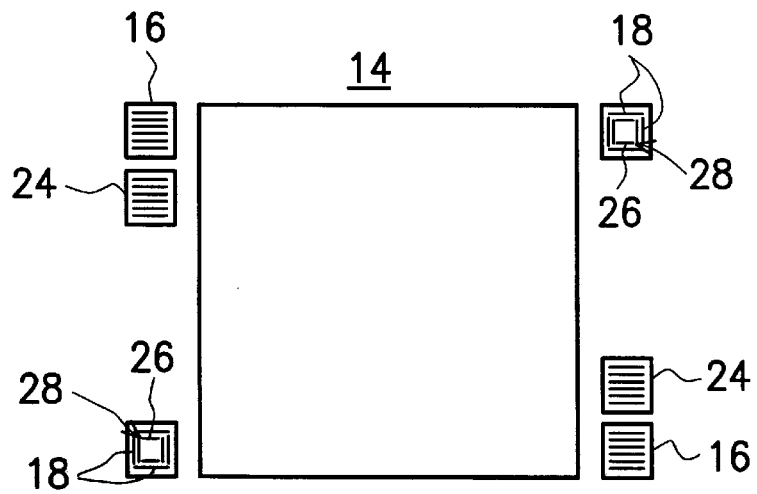

FIGS. 5A and 5B are diagrams showing alignment markers for exposure and overlay markers on a photoresist layer above a wafer. In step 140, the DUV exposure station under inspection exposes the photoresist layer above the wafer 12. The illuminated photoresist layer is developed so that an alignment marker 24 for exposure and an overlay marker 26 are formed just outside the edge of the shots such as 14, 14a and 14b. The overlay marker 26 is formed inside the area 28 marked by the overlay marker 18.

Figure 6A:
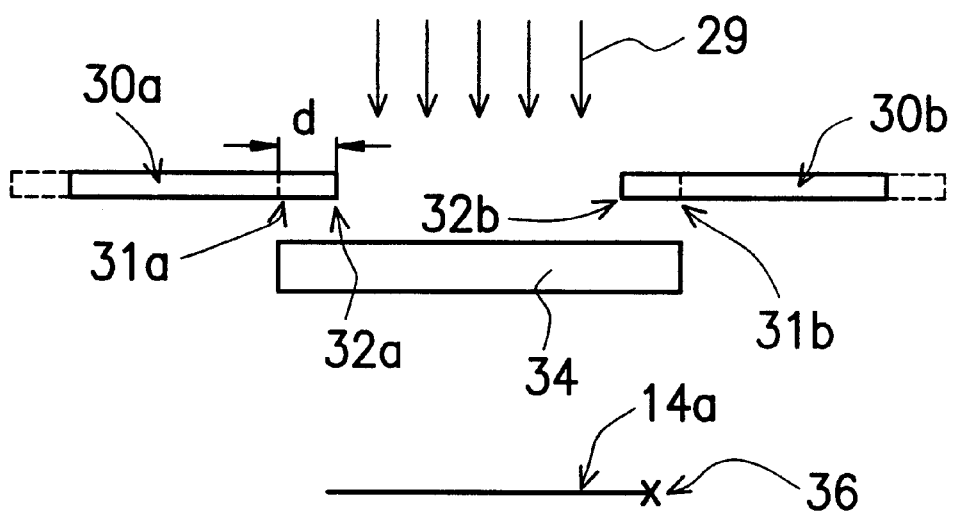
FIGS. 6A and 6B illustrate the process of determining reticle blind accuracy after a wafer is positioned inside a deep ultraviolet exposure station.
Figure 6B:
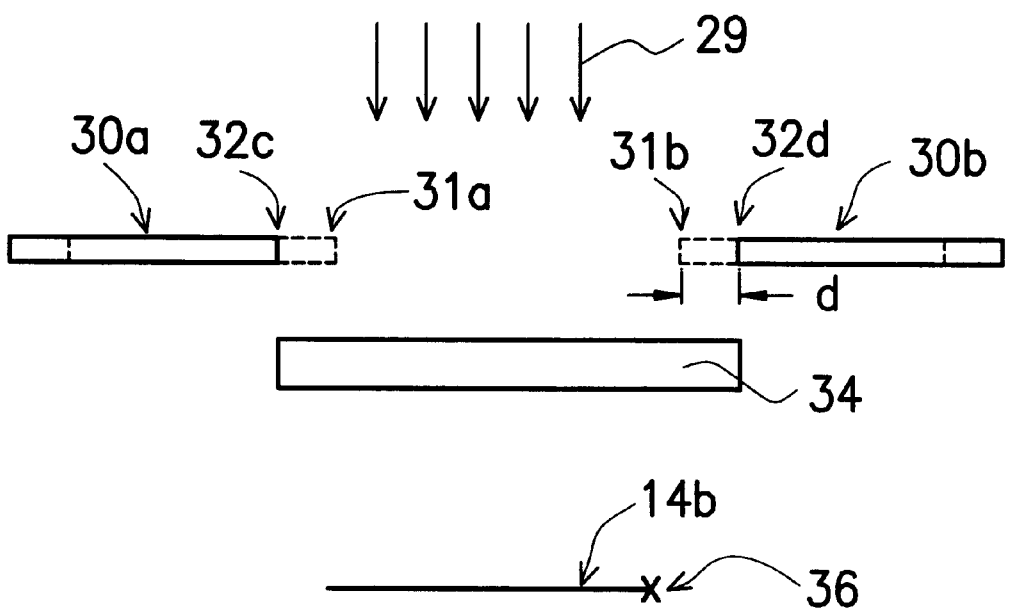

FIGS. 6A and 6B illustrate the process of determining reticle blind accuracy after a wafer is positioned inside a deep ultraviolet exposure station. As shown in FIGS. 6A and 6B, before exposure for shots 14a and 14b on the wafer 12 are conducted and concurrent with performing the step 140, the blinds 30a and 30b inside the to-be-inspected DUV exposure station have to be adjusted separately to determine an area that permits a light source 29 to pass.

Before the exposure of shot 14a is carried out, the blinds 30a and 30b are moved horizontally from the original position 31a and 31b to new positions 32a and 32b. The movement is horizontal in a direction parallel to a mask 34 so that distance between the blind 30a and the blind 30b is reduced. In effect, the adjusted positions 32a and 32b of the blinds 30a and 30b have moved a horizontal distance d from the original positions 31a and 31b.

Similarly, before the exposure of shot 14b is carried out, the blinds 30a and 30b are moved horizontally from the original position 31a and 31b to new positions 32c and 32d. The movement is horizontal in a direction parallel to a mask 34 so that distance between the blind 30a and the blind 30b is increased. In effect, the adjusted positions 32c and 32d of the blinds 30a and 30b have moved a horizontal distance d from the original positions 31a and 31b. The value of d is most probably set at half the degree of accuracy of the blinds 30a and 30b. In general, accuracy of the blinds 30a and 30b in a DUV exposure station is about 200 micrometers. Hence, d is preferably set at about 100 micrometers.

Step 150 is carried out next, transferring the wafer 12 from the DUV exposure station under inspection to an image-contrasting machine. Using the image-contrasting machine, the eye points 36 of each shot 14 are found. The eye points 36 are usually designed to be at the outermost edge of shot 14. In this invention, the image-contrasting machine is a KLA5XXX type of station, for example.

For shots 14a and 14b, due to the intentional shift in the horizontal direction of the blinds 30a and 30b relative to the photomask 34 at roughly half the accuracy of the blinds 30a and 30b, an error range can be determined faster. If the positioning eye points 36 of shots 14a and 14b are found by the image-contrasting machine, no incomplete or mutually interfered images are formed due to the intentional lowering of accuracy of the blinds 30a and 30b. In other words, accuracy provided by the blinds 30a and 30b in the original position 32 is higher than the accuracy after the horizontal shift. In contrast, if the positioning eye points 36 of shots 14a and 14b cannot be found, the positioning eye points 36 have led to the formation of incomplete or mutually interfered images. This indicates that accuracy provided by the blinds 30a and 30b in the original position 32 is most likely to be outside the acceptable range of accuracy. Under such circumstance, the blinds 30a and 30b of the DUV exposure station have to be adjusted to maintain the desired accuracy.

Step 160 is carried out next to determine the overlay accuracy of the to-be-inspected DUV exposure station. The image-contrasting station is again used to measure the positions of the overlay markers 18 and 24 near the edges of shot 14. From the measurement of relative positions between the overlay markers 18 and 24, overlay accuracy of the two exposures can be determined. The image-contrasting machine, for example, can be a KLA5XXX station whose capacity for measuring overlay accuracy can be as low as a few hundred angstroms.

Step 170 is carried out next to compute a value for overlay deviation due to two previous exposures according to the data obtained from positional measurement of the overlay markers 18 and 24. The recorded value is then fed back to the DUV exposure station under inspection so that such overlay errors can be accounted for and compensated. Therefore, the desired overlay accuracy is obtained once more.

In this invention, three usually separate conventional measurements including reticle blind accuracy, pre-alignment accuracy and overlay accuracy are integrated together. A patterned wafer having a photoresist layer thereon is provided. The photoresist layer on the wafer is exposed using a DUV exposure station. Relative positions of various markers are measured using an image-contrasting station. Hence, the reticle blind accuracy, the pre-alignment accuracy and the overlay accuracy are all determined in a single step.

According to this invention, the method for determining reticle blind accuracy only requires horizontal movement of the blinds relative to the photomask when exposures of the two shots are carried out. The horizontal adjustment can be finished within about 10 seconds. In other words, unlike a conventional process that takes about half an hour, only 10 more seconds than a light exposure operation is required. Time saved in the determination of accuracy of a DUV exposure station can be used for actual production. Additionally, reticle blind accuracy can be measured more frequently to increase the precision of the DUV exposure station.

In the determination of overlay accuracy, a large part of the measurement is conducted using a relatively inexpensive image-contrasting machine. In fact, the DUV exposure station is needed only for the relatively short period of returning the recorded overlay deviation. Hence, more spare time is available for production.

In summary, the method for monitoring the conditions of a DUV exposure station in this invention requires very little time, and so station checking can be conducted daily to ensure a higher product quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for monitoring operating conditions of a deep ultraviolet (DUV) exposure station, comprising the steps of:

providing a silicon wafer;

performing a photolithographic process on the silicon wafer using a DUV exposure system and performing an etching process using an etching station to form a plurality of first shots on the wafer such that each first shot also has a first alignment marker for exposure and a first overlay marker somewhere just outside an edge of the first shot;

forming a photoresist layer over the wafer;

placing the wafer into the DUV exposure station and recording an amount of shift between a loading position of the wafer inside the system and the center point of the first alignment marker for exposure;

exposing the photoresist layer using the DUV exposure station and developing the photoresist layer to form a plurality of second shots, a third shot and a fourth shot such that each second shot, third shot and fourth shot also have a second overlay marker somewhere just outside their edges, wherein before carrying out the exposure for the second shots, the third shot and the fourth shot, further includes:

arranging to have a blind of the DUV exposure station shifted by a first uncovered distance permitting light from a light source to pass for the second shot;

arranging to have the blind shifted by a second uncovered distance for the third shot such that the second uncovered distance is smaller than the first uncovered distance; and arranging to have the blind shifted by a third uncovered distance for the fourth shot such that the third uncovered distance is greater than the first uncovered distance;

inspecting the third shot and the fourth shot using an image-contrasting machine such that if both the third shot and the fourth shot can be found by the machine, the blind is within the required degree of accuracy, whereas if the machine is unable to find the third and the fourth shots, the blind is inaccurate and the DUV exposure station needs an adjustment; and measuring relative positions of the first overlay marker and the second overlay marker using the image-contrasting machine and computing a value of overlay deviation from two previous exposures, in which value of overlay deviation is fed into the DUV exposure station to compensate for any overlay inaccuracy.

2. The method of claim 1, wherein the specified first value is about 100 micrometers.

3. The method of claim 1, wherein the specified second value is about 100 micrometers.

4. The method of claim 1, wherein the means of determining whether the third shot and the fourth shot can be found includes looking for an eye point of the third shot and an eye point of the fourth shot using the image-contrasting machine.

* * * * *